(12) United States Patent
Rizzolo et al.

(10) Patent No.: US 10,692,925 B2
(45) Date of Patent: Jun. 23, 2020

(54) DIELECTRIC FILL FOR MEMORY PILLAR ELEMENTS

(71) Applicant: INTERNATIONAL BUSINESS MACHINES CORPORATION, Armonk, NY (US)

(72) Inventors: Michael Rizzolo, Albany, NY (US); Theodorus E. Standaert, Clifton Park, NY (US); Isabel Cristina Chu, Melrose, NY (US); Chih-Chao Yang, Glenmont, NY (US); Son Nguyen, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/159,220

(22) Filed: Oct. 12, 2018

(65) Prior Publication Data

US 2020/0119089 A1   Apr. 16, 2020

(51) Int. Cl.
| | |
|---|---|
| H01L 27/22 | (2006.01) |
| H01L 43/02 | (2006.01) |
| H01L 43/08 | (2006.01) |
| H01L 43/10 | (2006.01) |
| H01L 43/12 | (2006.01) |

(52) U.S. Cl.
CPC .......... *H01L 27/222* (2013.01); *H01L 43/02* (2013.01); *H01L 43/08* (2013.01); *H01L 43/10* (2013.01); *H01L 43/12* (2013.01)

(58) Field of Classification Search
CPC ....... H01L 27/222; H01L 43/02; H01L 43/08; H01L 43/10; H01L 43/12
USPC .......................................................... 257/421
See application file for complete search history.

(56) References Cited

U.S. PATENT DOCUMENTS

| | | | |
|---|---|---|---|
| 5,279,865 A | 1/1994 | Chebi et al. | |
| 6,261,893 B1 | 7/2001 | Chang et al. | |
| 6,358,845 B1 | 3/2002 | Lou | |
| 6,593,615 B1 | 7/2003 | Shu et al. | |
| 7,524,735 B1 | 4/2009 | Gauri et al. | |
| 8,153,502 B2 | 4/2012 | Li et al. | |
| 8,367,493 B1 | 2/2013 | Ngo et al. | |
| 8,557,712 B1 | 10/2013 | Antonelli et al. | |
| 8,822,234 B2 | 9/2014 | Wang et al. | |
| 9,935,261 B1 | 4/2018 | Patel et al. | |
| 10,043,657 B2 | 8/2018 | Swaminathan et al. | |
| 2009/0209050 A1 | 8/2009 | Wang et al. | |
| 2010/0117158 A1* | 5/2010 | Koide | H01L 21/823807 257/369 |
| 2011/0127626 A1* | 6/2011 | Li | B82Y 25/00 257/421 |

(Continued)

*Primary Examiner* — Tong-Ho Kim
(74) *Attorney, Agent, or Firm* — Tutunjian & Bitetto, P.C.; Vazken Alexanian

(57) ABSTRACT

A method for fabricating a semiconductor device includes forming one or more encapsulation spacers each about respective ones of one more memory pillar elements to have a geometry, including forming each encapsulation spacer to have a footing of at least about twice a critical dimension of its corresponding pillar, and depositing dielectric material on the one or more memory pillar elements and the one or more encapsulation spacers to form an interlayer dielectric free of voids based on the geometry.

20 Claims, 7 Drawing Sheets

(56) References Cited

U.S. PATENT DOCUMENTS

2013/0119494 A1 5/2013 Li et al.
2015/0188033 A1 7/2015 Lamborn et al.

* cited by examiner

400

```
┌─────────────────────────────────────────────────────────────────┐
│ Form a base structure including one or more pillars associated  │
│ with a memory device                                            │
│                              410                                │
└─────────────────────────────────────────────────────────────────┘
                                 │
                                 ▼
┌─────────────────────────────────────────────────────────────────┐
│ Form one or more sets of encapsulation spacers about respective │
│ ones of the one or more pillars to have a geometry              │
│                              420                                │
└─────────────────────────────────────────────────────────────────┘
                                 │
                                 ▼
┌─────────────────────────────────────────────────────────────────┐
│ Form an additional encapsulation spacer along the one or more   │
│ pillars and the one or more sets of encapsulation spacers       │
│                              430                                │
└─────────────────────────────────────────────────────────────────┘
                                 │
                                 ▼
┌─────────────────────────────────────────────────────────────────┐
│ Deposit dielectric material on the one or more pillars and the  │
│ one or more sets of encapsulation spacers to form an ILD free   │
│ of voids based on the geometry                                  │
│                              440                                │
└─────────────────────────────────────────────────────────────────┘
                                 │
                                 ▼
┌─────────────────────────────────────────────────────────────────┐
│ Form one or more top contacts on respective ones of the one or  │
│ more pillars                                                    │
│                              450                                │
└─────────────────────────────────────────────────────────────────┘
                                 │
                                 ▼
┌─────────────────────────────────────────────────────────────────┐
│ Form a dielectric cap layer on the ILD and the one or more top  │
│ contacts                                                        │
│                              460                                │
└─────────────────────────────────────────────────────────────────┘
```

FIG. 7

DIELECTRIC FILL FOR MEMORY PILLAR ELEMENTS

BACKGROUND

Technical Field

The present invention generally relates to semiconductor devices, and more particularly to dielectric fills for memory pillar elements and methods of fabricating the same.

Description of the Related Art

A memory cell is a component of a computer memory device that includes an electronic circuit that stores one bit of binary information. One type of memory cell is a random-access memory (RAM) cell. Examples of RAM memory devices include, e.g., volatile memory devices and non-volatile memory devices. One example of a non-volatile memory is magnetoresistive random-access memory (MRAM). In contrast to other RAM technologies, data in MRAM is not stored as electric charge or current flows, but by using magnetic storage elements. More specifically, MRAM can use a component called a magnetic tunnel junction (MTJ) to exploit the phenomenon of tunnel magnetoresistance (TMR).

SUMMARY

In accordance an embodiment of the present invention, a method for fabricating a semiconductor device is provided. The method includes forming one or more encapsulation spacers each about respective ones of one or more memory pillar elements to have a geometry, including forming each encapsulation spacer to have a footing of at least about twice a critical dimension of its corresponding pillar, and depositing dielectric material on the one or more memory pillar elements and the one or more encapsulation spacers to form an interlayer dielectric free of voids based on the geometry.

In accordance another embodiment of the present invention, a method for fabricating a semiconductor device is provided. The method includes providing a base structure associated with a magnetoresistive random-access memory (MRAM) device, forming one or more encapsulation spacers about respective ones of one more memory pillar elements of the base structure to have a geometry, including forming each encapsulation spacer to have a footing of at least about twice a critical dimension of its corresponding pillar, and depositing dielectric material on the one or more memory pillar elements and the one or more encapsulation spacers to form an interlayer dielectric free of voids based on the geometry.

In accordance with yet another embodiment of the present invention, a semiconductor device is provided. The device includes a base structure associated with a memory device, and one or more encapsulation spacers disposed about respective ones of one more memory pillar elements of the base structure. Each encapsulation spacer has a footing that is at least about twice a critical dimension of its corresponding pillar.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein:

FIG. 7 is a block/flow diagram illustrating a system/method for fabricating a semiconductor device including memory pillar elements, in accordance with an embodiment of the present invention.

DETAILED DESCRIPTION

Figure 1:
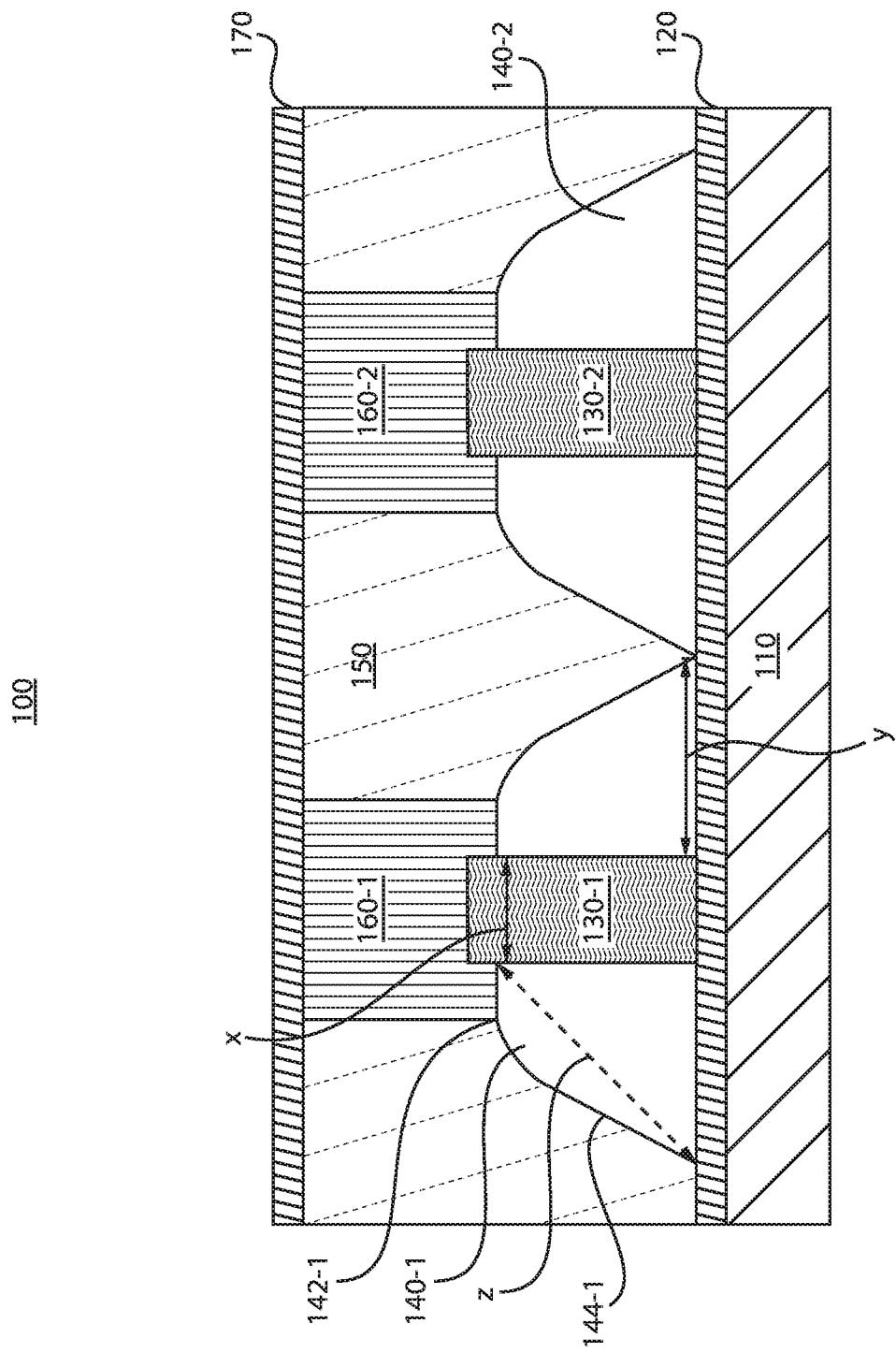
FIG. 1 is a cross-sectional view of a semiconductor device including memory pillar elements, in accordance with an embodiment of the present invention.

In a magnetoresistive random-access memory (MRAM) device, the elements are formed from two plates (e.g., ferromagnetic plates), each of which can hold a magnetic field, separated by a thin insulating layer. In some embodiments, one of the two plates is a permanent magnet set to a particular polarity, and the other plate's field can be changed to match that of an external field to store memory. The MRAM device is built from a grid of such "cells". The simplest method of reading is accomplished by measuring the electrical resistance of the cell. A particular cell is (typically) selected by powering an associated transistor that switches current from a supply line through the cell to ground. Due to the magnetic tunnel effect, the electrical resistance of the cell changes due to the orientation of the fields in the two plates. By measuring the resulting current, the resistance inside any particular cell can be determined, and from this the polarity of the writable plate. If the two plates have the same polarity this is considered to mean "1", while if the two plates are of opposite polarity the resistance will be higher and this cab mean "0". Data is written to the cells using a variety of means. In one embodiment, each cell may be positioned between a pair of write lines arranged at right angles to each other, above and below the cell. When current is passed through them, an induced magnetic field is created at the junction, which the writable plate picks up.

Using deposition techniques like chemical vapor deposition (CVD) to form interlayer dielectrics (ILDs) between memory pillar elements ("pillars") such as, e.g., magnetic tunnel junctions (MTJs), can result in seams or voids. Such voids can be dependent on the geometry of the encapsulation spacers formed about the pillars. For example, encapsulation spacers having a sharp sidewall angle (e.g., greater than about 70 degrees) can result in the detrimental formation of an ILD with one or more voids. Additionally, the voids can be dependent on, e.g., aspect ratio, pitch and sidewall angle, and can result in variable voiding.

To address at least the above-noted problems, the embodiments described herein provide for the formation of encapsulation spacers corresponding to pillars that modify pillar geometry to prevent voids resulting from the formation of ILDs using conventional processes. The encapsulation spacers can have a relatively thick width (e.g., about two-thirds the width of space between adjacent pillars). For example, each encapsulation spacer can have a thickness of, e.g., about 200 nm. In one embodiment, the footing of each encapsulation spacer can be at least about twice the critical dimension of its corresponding pillar (e.g., twice the width of the pillar). In photolithography, the term "critical dimension" can refer to the minimum feature size that a projection system can print. Such geometry can correspond to a sidewall angle of, e.g., less than about 70 degrees, thereby promoting the formation of improved ILDs free of voids.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

With reference to FIG. 1, a cross-sectional view of a semiconductor device 100 is provided. The device 100 can include a memory device. In one embodiment, the memory device includes an random-access memory (RAM) device. For example, the memory device can include, e.g., a magnetoresistive RAM (MRAM) device. The memory device can be an embedded memory device.

The device 100 is shown including a bottom contact 110. The bottom contact 110 can include any suitable conductive material in accordance with the embodiments described herein. For example, the bottom contact 110 can include, e.g., copper (Cu), cobalt (Co), TaN/Ta, ruthenium (Ru), and/or other BEOL conductive materials or metals.

The device 100 is shown including a dielectric cap layer 120 disposed on the bottom contact 110. The dielectric cap layer 120 can include any suitable dielectric material in accordance with the embodiments described herein. Examples of suitable materials for the dielectric cap layer 220 can include, but are not limited to, a silicon nitride material (e.g., SiN), a silicon carbonitride material (e.g., SiCN), a silicon oxynitride material (e.g., SiNO), a silicon carbide material (e.g., SiC), and combinations thereof.

The device 100 is shown including a plurality of memory pillar elements ("pillars") 130-1 and 130-2. In one embodiment, the pillars 230-1 and 230-2 correspond to magnetic tunnel junctions (MTJs). As described above, MTJs can include two ferromagnets separated by a tunnel barrier including an insulator material. The tunnel barrier should be sufficiently thin to allow for electrons to tunnel from one ferromagnet into the other in accordance with tunnel magnetoresistance (TMR). For example, the tunnel barrier can have a thickness of, e.g., about a few nanometers. A tunnel barrier can include any suitable insulator material in accordance with the embodiments described herein. Examples of suitable insulator materials include, but are not limited to, magnesium oxide (MgO) and aluminum oxide ($Al_2O_3$). MTJs can be fabricated using one or more thin film technology processes. For example, MTJs can be fabricated using one or more of, e.g., sputter deposition, molecular beam epitaxy, pulsed laser deposition, and any type of physical vapor deposition (PVD).

The device 100 is shown including encapsulation spacers 140-1 and 140-2. As shown, the encapsulation spacer 140-1 is disposed about (e.g., surround) a corresponding sidewall of the pillar 130-1 below a height of the pillar 130-1, and the encapsulation spacer 140-2 is disposed about (e.g., surround) a corresponding sidewall of the pillar 130-2 below a height of the pillar 130-2. The encapsulation spacers 140-1 and 140-2 can nclude any suitable material in accordance with the embodiments described herein. Examples of suitable materials for the encapsulation spacers 140-1 and 140-2 can include, but are not limited to, a silicon oxide material (e.g., $SiO_2$), a silicon nitride material (e.g., SiN), a silicon carbonitride material (e.g., SiCN), a silicon oxynitride material (e.g., SiNO), a silicon carbide material (e.g., SiC), and combinations thereof.

The device 100 is shown including an interlayer dielectric (ILD) 150 and top contacts 160-1 and 160-2. For example, the top contact 160-1 is formed on the pillar 130-1 and a top surface 142-1 of the encapsulation spacer 140-1. As shown, the ILD 150 fills in the gaps between the encapsulation spacers 140-1 and 140-2, and between the top contacts 160-1 and 160-2. The ILD 150 and the top contacts 160-1 and 160-2 can each include any suitable material in accordance with the embodiments described herein. The ILD 150 can include, e.g., $SiO_2$, and the top contacts 160-1 and 160-2 can include, e.g., copper (Cu), cobalt (Co), TaN/Ta, ruthenium (Ru), and/or other BEOL conductive materials or metals. The top contact etch used to form the top contacts 160-1 and 160-2 can stop on the encapsulation spacers 140-1 and 140-2, respectively, which can prevent the risk of over-etch to the tunnel barrier on the pillars 130-1 and 130-2, or to the bottom contact 110.

The encapsulation spacers 140-1 and 140-2 can each have a slope sidewall suitable for the improved formation of the ILD 150 such that the ILD 150 is free of voids, such as, e.g., sidewall 144-1 of encapsulation spacer 140-1. For example, to achieve the lack of voids during the formation of the ILD 150, the encapsulation spacers 140-1 and 140-2 can have a thickness suitable to change the sidewall angle and gap during the filling of dielectric material during formation of the ILD 150. The encapsulation spacers 140-1 and 140-2 can have a width of about, e.g., two-thirds of the width of space between the pillars 130-1 and 130-2. In one embodiment, the footing ("y") of the encapsulation spacers 140-1 and 140-2 can be at least about twice the critical dimension ("x") of the corresponding pillars 130-1 and 130-2, respectively (e.g., twice the width of the corresponding pillars 130-1 and 130-2). Such a geometry can provide for a suitably gentle sloped sidewall from the bottom of the encapsulation spacers 140-1 and 140-2 to the top of the encapsulation spacers 140-1 and 140-2 (corresponding to the line "z") for improved formation of the ILD 150.

The encapsulation spacers 140-1 and 140-2 can include tapered encapsulation spacers having a titled angle greater than, e.g., about 45 degrees. More specifically, the encapsulation spacers 140-1 and 140-2 can include encapsulation spacers having a titled angle between, e.g., about 60 degrees to about 80 degrees. In one embodiment, the encapsulation spacers 140-1 and 140-2 can be continuous between the pillars 130-1 and 130-2. In another embodiment, the encapsulation spacers 140-1 and 140-2 can be discontinuous between the pillars 130-1 and 130-2.

As further shown in FIG. 1, a dielectric cap layer 170 is disposed on the ILD 150 and the top contacts 160-1 and 160-2. The dielectric cap layer 170 can include any suitable dielectric material in accordance with the embodiments described herein. For example, the dielectric cap layer 170 can include, e.g., a silicon nitride material (e.g., SiN), a silicon carbonitride material (e.g., SiCN), a silicon oxynitride material (e.g., SiNO), a silicon carbide material (e.g., SiC), and combinations thereof.

Figure 2:
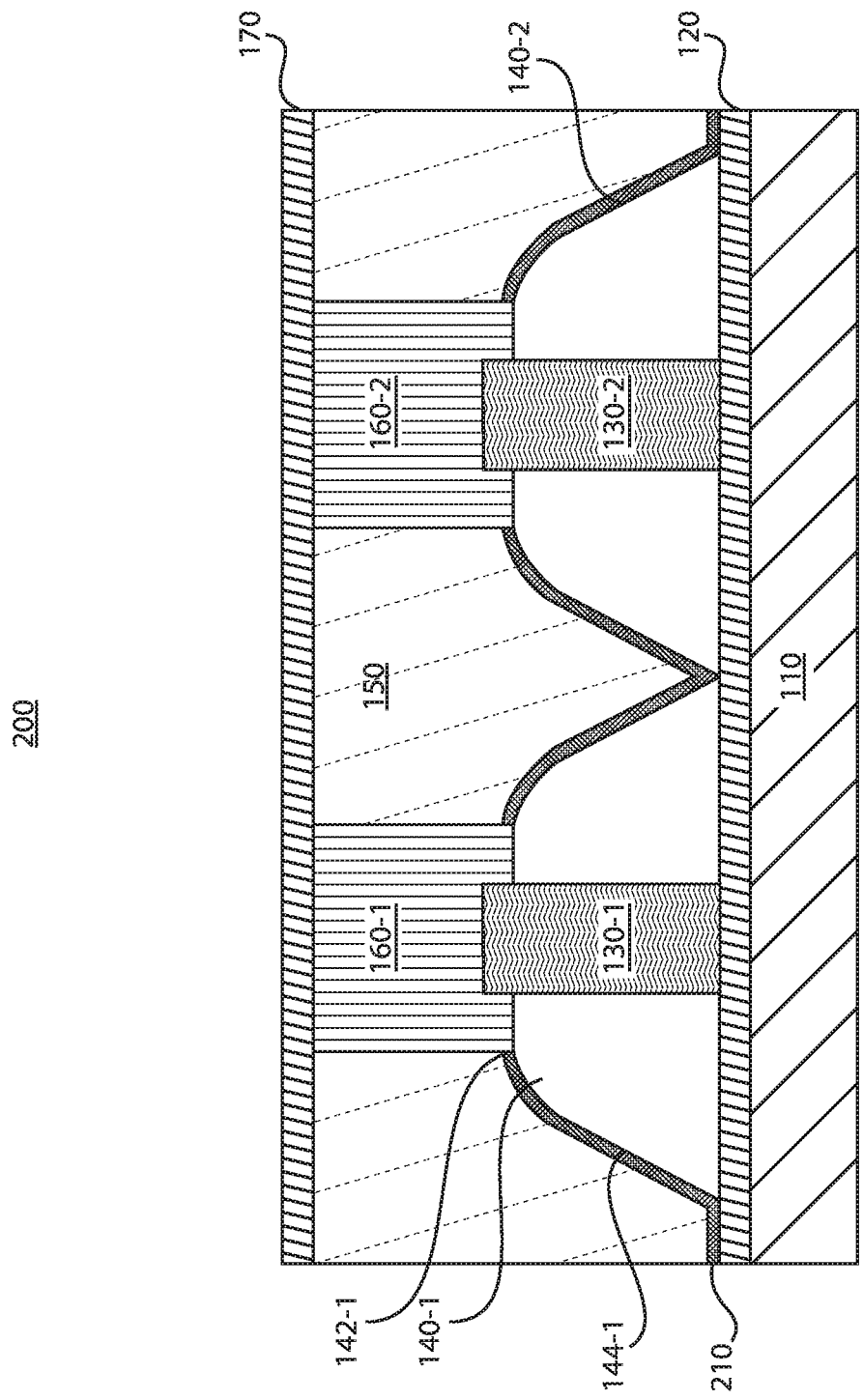
FIG. 2 is a cross-sectional view of a semiconductor device including memory pillar elements, in accordance with another embodiment of the present invention.

With reference to FIG. 2, a cross-sectional view of a semiconductor device 200 is provided. Similar to the device 100, the device 200 includes bottom contact 110, dielectric cap layer 120, pillars 130-1 and 130-1, encapsulation spacers 140-1 and 240-2, ILD 150, top contacts 160-1 and 160-2, and dielectric cap layer 170.

However, in this illustrative embodiment, an additional encapsulation spacer 210 is formed along the thick spacer prior to depositing the ILD 150. For example, the additional encapsulation spacer 210 can be formed along the surfaces of the pillars 130-1 and 130-2 and the encapsulation spacers 140-1 and 140-2, and the additional encapsulation spacer 210 can be opened at the top to form the top contacts 150-1 and 150-2 by etching. The additional encapsulation spacer 210 can be formed using any suitable process in accordance with the embodiments described herein, and can include any suitable material in accordance with the embodiments described herein. For example, the additional encapsulation spacer 210 can include, e.g., a silicon oxide material (e.g., SiO$_2$), a silicon nitride material (e.g., SiN), a silicon carbonitride material (e.g., SiCN), a silicon oxynitride material (e.g., SiNO), a silicon carbide material (e.g., SiC), and combinations thereof.

A process flow for fabricating a semiconductor device including a memory device for embedding (e.g., the device 100 of FIG. 1 or the device 200 of FIG. 2) will now be described with reference to FIGS. 3-6.

Figure 3:
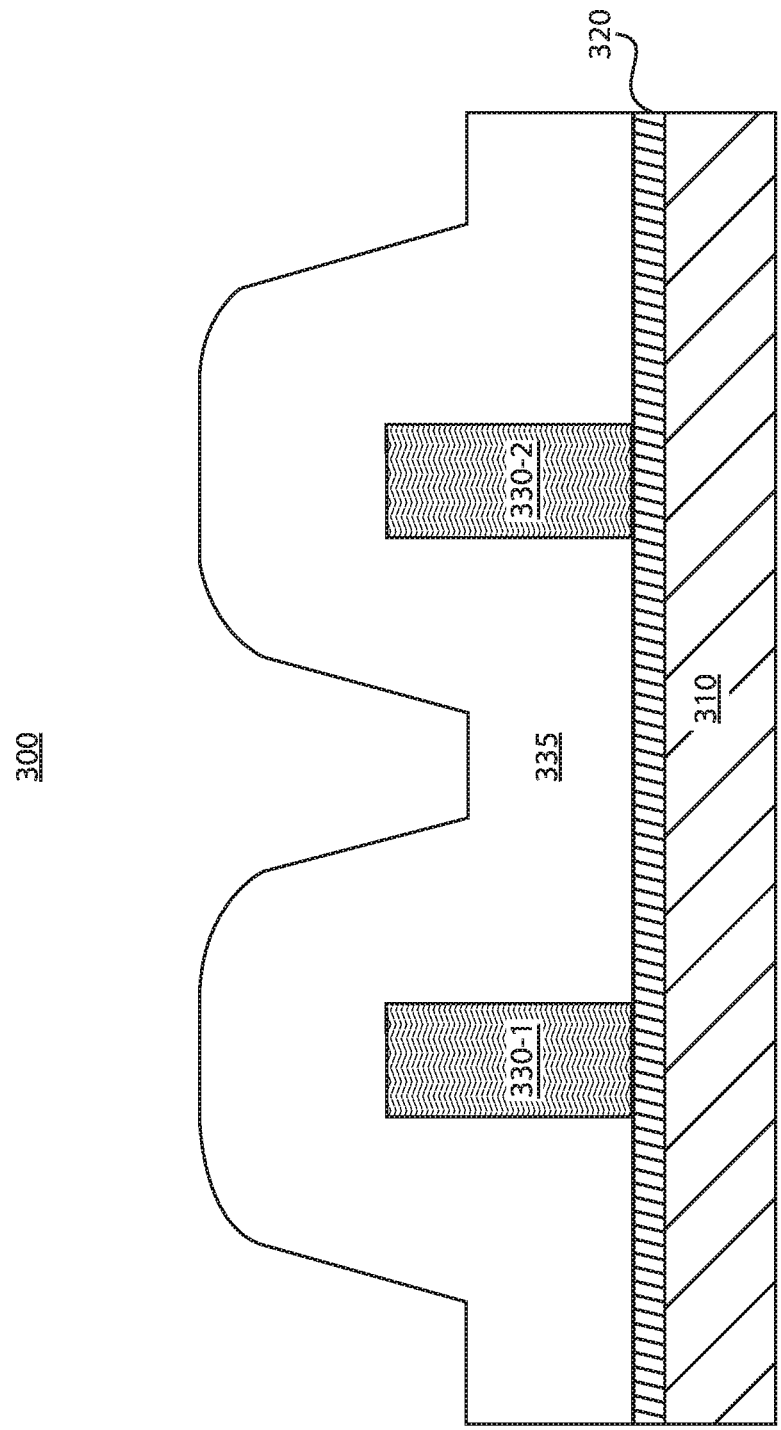
FIG. 3 is a cross-sectional view of the formation of an encapsulation space during the fabrication of a semiconductor device, in accordance with an embodiment of the present invention.

With reference to FIG. 3, encapsulation spacer material 335 is formed on a base structure associated with a memory device. As shown in FIG. 3, the base structure includes a bottom contact 310, a dielectric cap layer 320, and memory pillar elements ("pillars") 330-1 and 330-2. In one embodiment, the pillars 330-1 and 330-2 correspond to MTJs of an MRAM memory device.

The bottom contact 310 and the dielectric cap layer 320 can include any suitable materials in accordance with the embodiments described herein. For example, the bottom contact 310 can include, e.g., copper (Cu), cobalt (Co), TaN/Ta, ruthenium (Ru), and/or other BEOL conductive materials or metals, and the dielectric cap layer 320 can include, e.g., a silicon nitride material (e.g., SiN), a silicon carbonitride material (e.g., SiCN), a silicon oxynitride material (e.g., SiNO), a silicon carbide material (e.g., SiC), and combinations thereof.

The encapsulation spacer material 335 can have a thickness depending on pitch. For example, the encapsulation spacer material 335 can have a thickness between, e.g., about 50 nm to about 500 nm, depending on the pitch. The encapsulation spacer material 335 can include any suitable material in accordance with the embodiments described herein. For example, the encapsulation spacer material 335 can include, e.g., a silicon oxide material (e.g., SiO$_2$), a silicon nitride material (e.g., SiN), a silicon carbonitride material (e.g., SiCN), a silicon oxynitride material (e.g., SiNO), a silicon carbide material (e.g., SiC), and combinations thereof.

Figure 4:
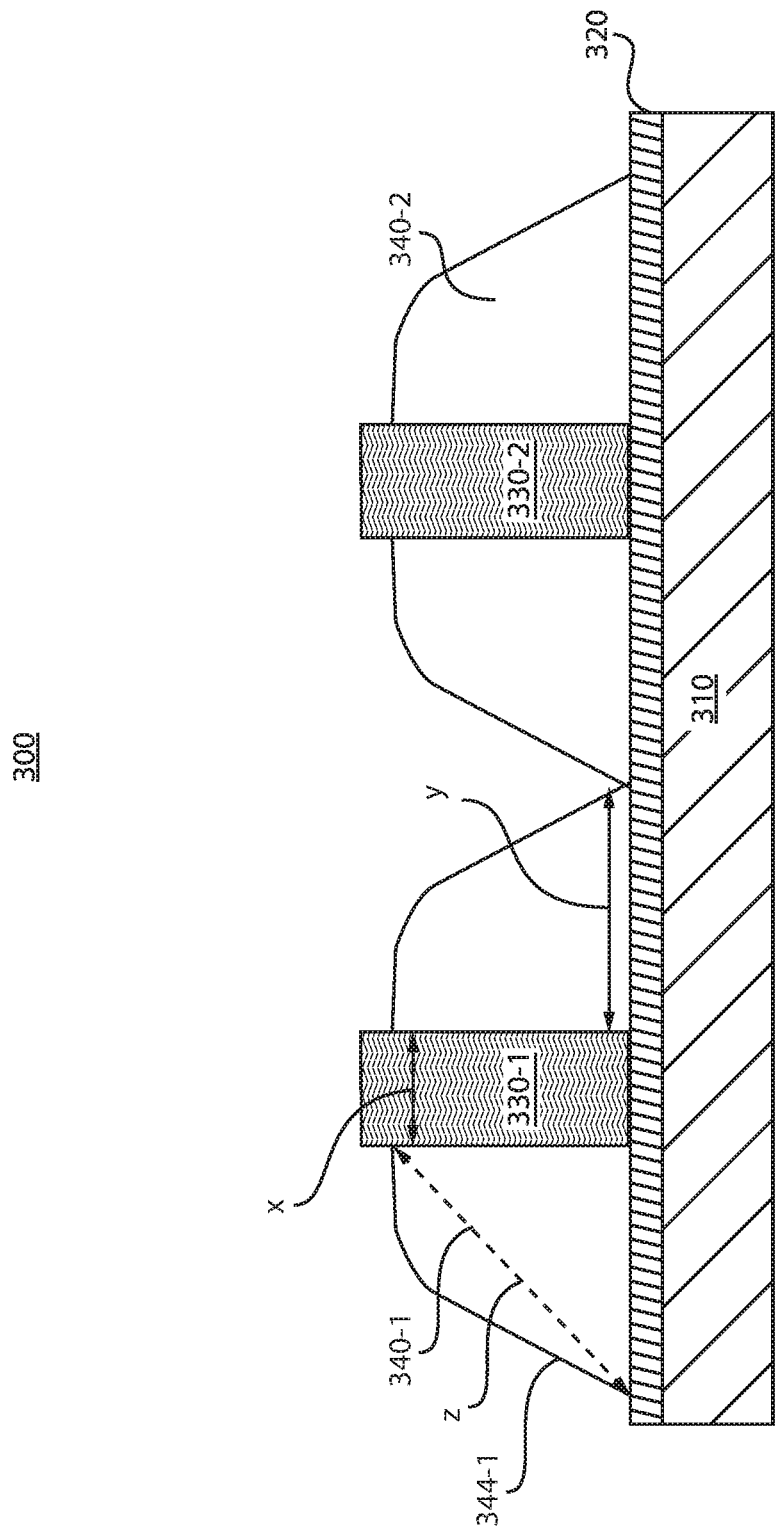
FIG. 4 is a cross-sectional view of encapsulation spacer etch back performed during the fabrication of the semiconductor device, in accordance with an embodiment of the present invention.

With reference to FIG. 4, the encapsulation spacer material 335 is etched back to form encapsulation spacers 340-1 and 340-2, where encapsulation spacer 340-1 is shown including a top surface 342-1 and a sidewall 344-1. The encapsulation spacers 340-1 and 340-2 can be formed to have a sloped sidewall (e.g., sidewall 344-1) suitable for the improved formation of an ILD that is free of voids. For example, to achieve the lack of voids during the formation of an ILD, the encapsulation spacers 340-1 and 340-2 can have a thickness suitable to change the sidewall angle and gap during the filling of dielectric material to form an ILD. The encapsulation spacers 340-1 and 340-2 can have a width of about, e.g., two-thirds of the width of space between the pillars 330-1 and 330-2. In one embodiment, the footing ("y") of the encapsulation spacers 340-1 and 340-2 can be at least about twice the critical dimension ("x") of the corresponding pillars 330-1 and 330-2, respectively (e.g., twice the width of the corresponding pillars 330-1 and 330-2). Such a geometry can provide for a suitably gentle sloped sidewall from the bottom of the encapsulation spacers 340-1 and 340-2 to the top of the encapsulation spacers 340-1 and 340-2 (corresponding to the line "z") for the improved ILD formation.

The encapsulation spacers 340-1 and 340-2 can include tapered encapsulation spacers having a titled angle greater than, e.g., about 45 degrees. More specifically, the encapsulation spacers 340-1 and 340-2 can include encapsulation spacers having a titled angle between, e.g., about 60 degrees to about 80 degrees. In one embodiment, the encapsulation spacers 340-1 and 340-2 can be continuous between the pillars 330-1 and 330-2. In another embodiment, the encapsulation spacers 340-1 and 340-2 can be discontinuous between the pillars 330-1 and 330-2.

In one embodiment, after the etchback is performed to form the encapsulation spacers 340-1 and 340-2, an additional encapsulation spacer (not shown) can be formed along the surfaces of the pillars 330-1 and 330-4 and the encapsulation spacers 340-1 and 340-2. The additional encapsulation spacer can be formed using any suitable process in accordance with the embodiments described herein, and can include any suitable material in accordance with the embodiments described herein. For example, the additional encapsulation spacer can include, e.g., a silicon oxide material (e.g., SiO$_2$), a silicon nitride material (e.g., SiN), a silicon carbonitride material (e.g., SiCN), a silicon oxynitride material (e.g., SiNO), a silicon carbide material (e.g., SiC), and combinations thereof. Further details regarding the additional encapsulation spacer are described above with reference to FIG. 2.

Figure 5:
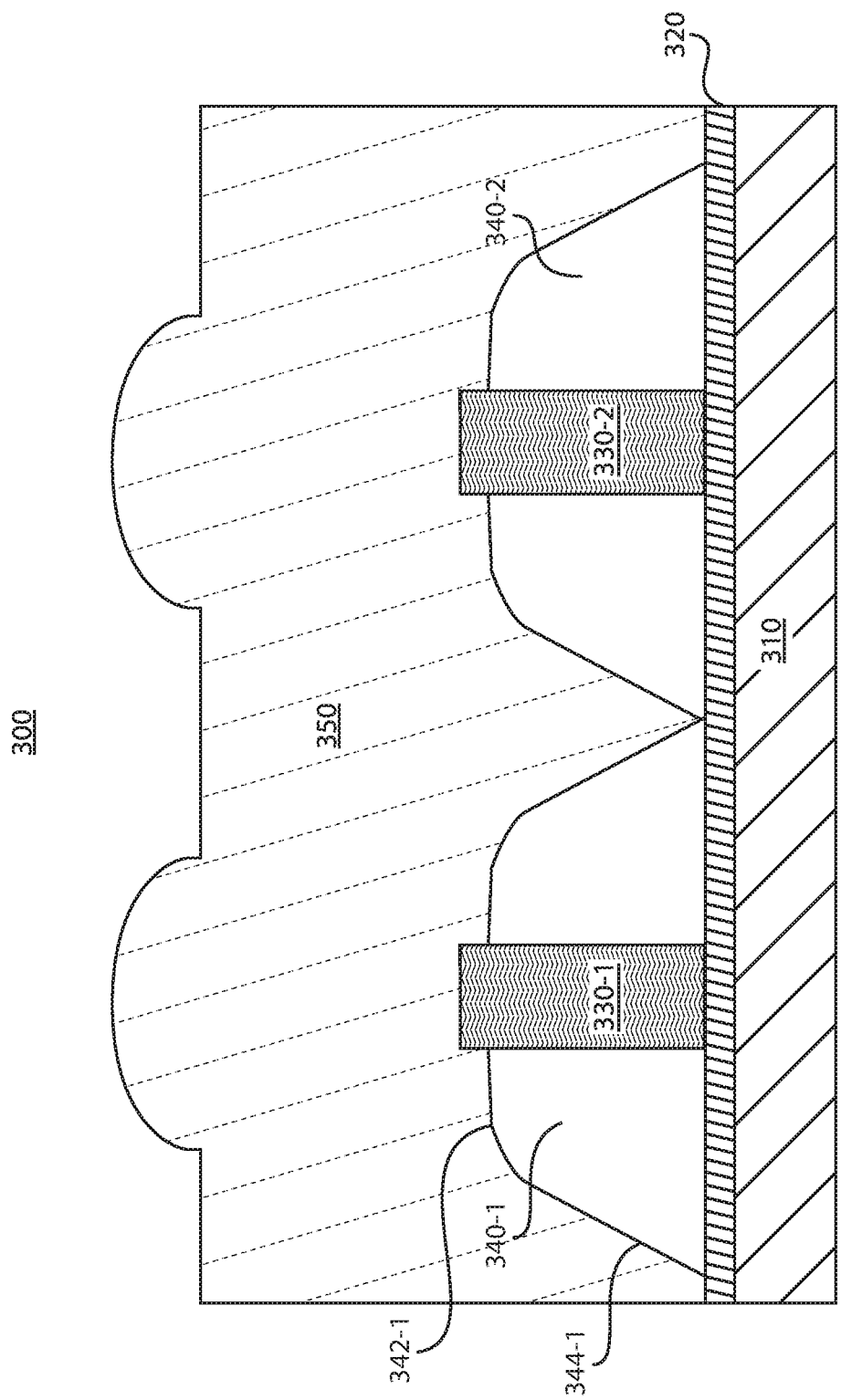
FIG. 5 is a cross-sectional view of the formation of an interlayer dielectric during the fabrication of the semiconductor device, in accordance with an embodiment of the present invention.

With reference to FIG. 5, an ILD 350 is formed by depositing dielectric material on the pillars 330-1 and 330-2 and the encapsulation spacers 340-1 and 340-2. As mentioned above, due to the geometry of the encapsulation spacers 340-1 and 340-2 (e.g., the slope defined by the sidewalls of the encapsulation spacers), the ILD 350 is formed such that it lacks voids.

Figure 6:
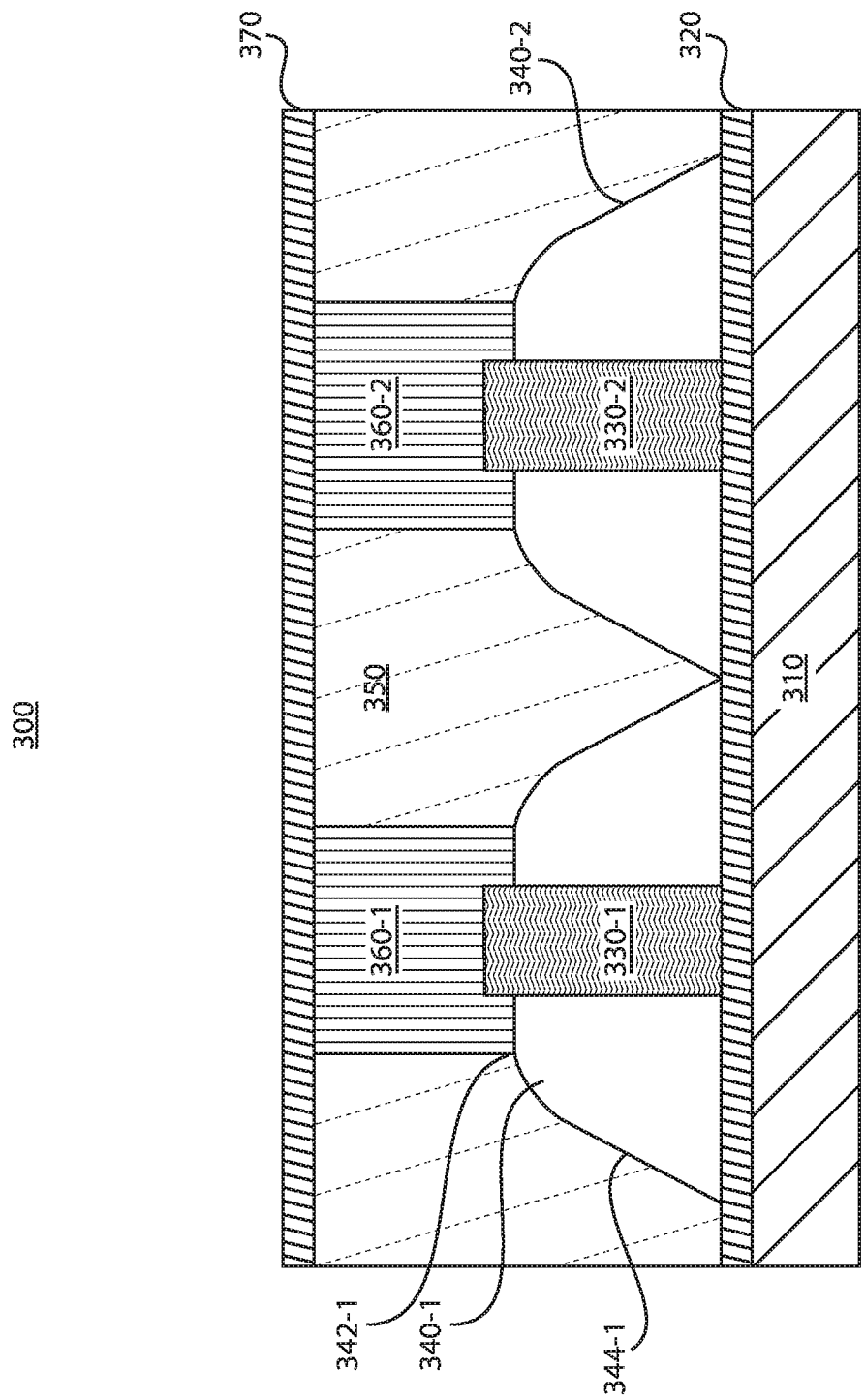
FIG. 6 is a cross-sectional view of further processing performed during the fabrication of the semiconductor device, in accordance with an embodiment of the present invention.

With reference to FIG. 6, further processing is performed to form top contacts 360-1 and 360-2 on the pillars 330-1 and 330-2 and the encapsulation spacers 340-1 and 340-2, respectively. For example, the ILD 350 can be planarized and/or etched using any suitable processes in accordance with the embodiments described herein to create an opening for top contacts 360-1 and 360-2 formed on the pillars 330-1 and 330-2 and the top surfaces of the encapsulation spacers 340-1 and 340-2, respectively. The top contact etch used to form the top contacts 360-1 and 360-2 stops on the encapsulation spacers 340-1 and 340-2, thereby preventing the risk of over-etch to the tunnel barrier on the pillars 330-1 and 330-2, or to the bottom contact 310. The top contacts 360-1 and 360-2 can include any suitable material in accordance with the embodiments described herein. For example, the top contacts 360-1 and 360-2 can include, e.g., copper (Cu), cobalt (Co), TaN/Ta, ruthenium (Ru), and/or other BEOL conductive materials or metals.

As further shown in FIG. 6, a dielectric cap layer 370 is formed on the ILD 350 and the top contacts 360-1 and 360-2. The dielectric cap layer 370 can include any suitable dielectric material in accordance with the embodiments described herein. For example, the dielectric cap layer 370 can include, e.g., a silicon nitride material (e.g., SiN), a silicon carbonitride material (e.g., SiCN), a silicon oxynitride material (e.g., SiNO), a silicon carbide material (e.g., SiC), and combinations thereof.

With reference to FIG. 7, a block/flow diagram is provided illustrating a system/method 400 for fabricating a semiconductor device.

At block 410, a base structure including one or more memory pillar elements ("pillars") associated with a memory device is provided. In one embodiment, the one or more pillars correspond to one or more MJTs of an MRAM device. The base structure can further include a bottom contact, and a dielectric cap layer formed on the bottom contact. The bottom contact and the dielectric cap layer can be formed to include any suitable materials in accordance with the embodiments described herein. For example, the bottom contact can be formed to include, e.g., copper (Cu), cobalt (Co), TaN/Ta, ruthenium (Ru), and/or other BEOL conductive materials or metals, and the dielectric cap layer can be formed to include, e.g., a silicon nitride material (e.g., SiN), a silicon carbonitride material (e.g., SiCN), a silicon oxynitride material (e.g., SiNO), a silicon carbide material (e.g., SiC), and combinations thereof. The base structure and the components thereof can be formed using any suitable process in accordance with the embodiments described herein.

At block 420, one or more encapsulation spacers are formed about respective ones of the one or more pillars. For example, the one or more encapsulation spacers can be formed along the sidewalls of the one or more pillars. In one embodiment, forming the encapsulation spacers includes forming (e.g., depositing) encapsulation material on the base structure, and etching back the encapsulation spacer material to form the one or more encapsulation spacers. The encapsulation spacer material can be formed to have a thickness depending on pitch. For example, the encapsulation spacer material can be formed to have a thickness between, e.g., about 50 nm to about 500 nm, depending on the pitch. The encapsulation spacer material can include any suitable material in accordance with the embodiments described herein. For example, the encapsulation spacer material can include, e.g., a silicon oxide material (e.g., $SiO_2$), a silicon nitride material (e.g., SiN), a silicon carbonitride material (e.g., SiCN), a silicon oxynitride material (e.g., SiNO), a silicon carbide material (e.g., SiC), and combinations thereof.

The one or more encapsulation spacers can be formed to have a sloped sidewall suitable for the improved formation of an ILD free of voids. For example, to achieve the lack of voids during the formation of an ILD, the one or more encapsulation spacers can be formed to have a thickness suitable to change the sidewall angle and gap during the filling of dielectric material to form an interlayer dielectric (ILD). In an embodiment where the base structure is formed to include a plurality of pillars, the corresponding encapsulation spacers can be formed to have a width of about, e.g., two-thirds of the width of space between adjacent ones of the pillars. In one embodiment, each of the one or more encapsulation spacers of can be formed to have a footing that is at least about twice the critical dimension of its corresponding pillar (e.g., twice the width of the corresponding pillar). Such a geometry can provide for a gentler sloped sidewall from the bottom of a given one of the one or more encapsulation spacers to the top of the given encapsulation spacer for the improved ILD formation.

The one or more encapsulation spacers can each be formed to have a titled angle greater than, e.g., about 45 degrees. More specifically, the one or more encapsulation spacers can each be formed to have a titled angle between, e.g., about 60 degrees to about 80 degrees. In an embodiment where the base structure is formed to include a plurality of pillars, in one embodiment, the corresponding encapsulation spacers are continuous between adjacent ones of the pillars. In another embodiment, the corresponding encapsulation spacers are discontinuous between adjacent ones of the pillars.

At block 430, an additional encapsulation spacer can be formed along the one or more pillars and the one or more encapsulation spacers. The additional encapsulation spacer can include any suitable material in accordance with the embodiments described herein. For example, the additional encapsulation spacer can include, e.g., a silicon oxide material (e.g., $SiO_2$), a silicon nitride material (e.g., SiN), a silicon carbonitride material (e.g., SiCN), a silicon oxynitride material (e.g., SiNO), a silicon carbide material (e.g., SiC), and combinations thereof.

At block 440, dielectric material is deposited on the one or more pillars and the one or more encapsulation spacers to form an ILD. As mentioned above, due to the geometry of the one or more encapsulation spacers (e.g., the slope defined by the sidewalls of the one or more encapsulation spacers), the ILD is formed such that it lacks voids.

At block 450, one or more top contacts are formed on respective ones of the one or more pillars. For example, the ILD can be planarized and/or etched using any suitable processes in accordance with the embodiments described herein to create one or more openings for the one or more top contacts. The one or more top contacts can be formed to include any suitable material in accordance with the embodiments described herein. For example, the one or more top contacts can include, e.g., copper (Cu), cobalt (Co), TaN/Ta, ruthenium (Ru), and/or other BEOL conductive materials or metals. Forming the one or more top contacts can include performing a top contact etch. The top contact etch used to form the one or more top contacts stops on the one or more encapsulation spacers, thereby preventing the risk of over-etch to the tunnel barrier of the one or more pillars, or to the bottom contact.

At block 460, a dielectric cap layer is formed on the ILD and the one or more top contacts. The dielectric cap layer can include any suitable dielectric material in accordance with the embodiments described herein. For example, the dielectric cap layer can include, e.g., a silicon nitride material (e.g., SiN), a silicon carbonitride material (e.g., SiCN), a silicon oxynitride material (e.g., SiNO), a silicon carbide material (e.g., SiC), and combinations thereof.

Further details regarding blocks 410-460 of the system/method described with reference to FIG. 7 are provided above with reference to FIGS. 1-6.

The embodiments described herein with reference to FIGS. 1-7 can provide for the formation of semiconductor devices including encapsulation spacers corresponding to respective pillars that modify pillar geometry to prevent voids resulting from the formation of ILDs using conventional processes. The encapsulation spacers can have a relatively thick width (e.g., about two-thirds the width of space between adjacent pillars). For example, each encapsulation spacer can have a thickness of, e.g., about 200 nm. In one embodiment, the footing of each encapsulation spacer can be at least about twice the critical dimension of its corresponding pillar. Such geometry can correspond to a sidewall angle of, e.g., less than about 70 degrees, thereby promoting the formation of improved ILDs free of voids.

Having described preferred embodiments of a semiconductor device and a method of forming dielectric fills for memory pillar elements (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for fabricating a semiconductor device, comprising:

forming one or more encapsulation spacers each about respective ones of one more memory pillar elements to have a geometry, including forming each encapsulation spacer to have a footing of at least about twice a critical dimension of its corresponding pillar; and depositing dielectric material on the one or more memory pillar elements and the one or more encapsulation spacers to form an interlayer dielectric free of voids based on the geometry.

2. The method of claim 1, wherein forming the one or more encapsulation spacers includes depositing encapsulation material on a base structure, and etching back the encapsulation spacer material to form the one or more encapsulation spacers.

3. The method of claim 2, wherein the encapsulation material is deposited to have a thickness depending on pitch.

4. The method of claim 3, wherein the encapsulation material is deposited to have a thickness between about 50 nm to about 500 nm depending on the pitch.

5. The method of claim 1, further comprising forming an additional spacer layer along the one or more memory pillar elements and the one or more encapsulation spacers.

6. The method of claim 1, further comprising forming one or more contacts on respective ones of the one or more memory pillar elements and the one or more encapsulation spacers.

7. The method of claim 6, further comprising forming a dielectric cap layer on the interlayer dielectric and the one or more contacts.

8. The method of claim 1, wherein the one or more memory pillar elements are associated with a magnetoresistive random-access memory (MRAM) device.

9. A method for fabricating a semiconductor device, comprising:

forming a base structure associated with a magnetoresistive random-access memory (MRAM) device;

forming one or more encapsulation spacers about respective ones of one more memory pillar elements of the base structure to have a geometry, including forming each encapsulation spacer to have a footing of at least about twice a critical dimension of its corresponding pillar; and depositing dielectric material on the one or more memory pillar elements and the one or more encapsulation spacers to form an interlayer dielectric free of voids based on the geometry.

10. The method of claim 9, wherein forming the one or more encapsulation spacers includes depositing encapsulation material on the base structure, and etching back the encapsulation spacer material to form the one or more encapsulation spacers.

11. The method of claim 10, wherein the encapsulation material is deposited to have a thickness depending on pitch.

12. The method of claim 11, wherein the encapsulation material is deposited to have a thickness between about 50 nm to about 500 nm depending on the pitch.

13. The method of claim 9, further comprising forming an additional spacer layer along the one or more memory pillar elements and the one or more encapsulation spacers.

14. The method of claim 9, further comprising forming one or more contacts on respective ones of the one or more memory pillar elements and the one or more encapsulation spacers.

15. The method of claim 14, further comprising forming a dielectric cap layer on the interlayer dielectric and the one or more contacts.

16. A semiconductor device, comprising:

a base structure associated with a memory device; and one or more encapsulation spacers disposed about respective ones of one more memory pillar elements of the base structure, wherein each encapsulation spacer has a footing that is at least about twice a critical dimension of its corresponding pillar.

17. The device of claim 16, further comprising an additional spacer layer disposed along the one or more memory pillar elements and the one or more encapsulation spacers.

18. The device of claim 16, further comprising an interlayer dielectric including dielectric material disposed on the one or more memory pillar elements and the one or more encapsulation spacers.

19. The device of claim 18, further comprising one or more contacts disposed on respective ones of the one or more memory pillar elements and the one or more encapsulation spacers.

20. The device of claim 19, further comprising a dielectric cap layer disposed on the interlayer dielectric and the one or more contacts.

* * * * *